(12) United States Patent
Park et al.

(10) Patent No.: US 9,546,415 B2
(45) Date of Patent: Jan. 17, 2017

(54) COMPOSITE TRANSPARENT ELECTRODES

(71) Applicant: Samsung Electronics Co., Ltd., Suwon-Si, Gyeonggi-Do (KR)

(72) Inventors: Hyeon Cheol Park, Hwaseong-si (KR); Kwang Hee Kim, Seoul (KR); Chan Kwak, Gyeonggi-do (KR); Yoon Chul Son, Hwaseong-si (KR); Sang Mock Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/488,999

(22) Filed: Sep. 17, 2014

(65) Prior Publication Data

US 2015/0187451 A1 Jul. 2, 2015

(30) Foreign Application Priority Data

Jan. 2, 2014 (KR) .................. 10-2014-0000364

(51) Int. Cl.
| | |
|---|---|
| *H01B 1/02* | (2006.01) |
| *H01B 13/00* | (2006.01) |
| *C23C 14/00* | (2006.01) |
| *G06F 3/041* | (2006.01) |
| *H01L 31/0224* | (2006.01) |

(Continued)

(52) U.S. Cl.
CPC ......... *C23C 14/0036* (2013.01); *C23C 14/024* (2013.01); *C23C 14/0617* (2013.01); *C23C 14/0641* (2013.01); *C23C 14/086* (2013.01); *G06F 3/041* (2013.01); *H01B 1/00* (2013.01); *H01B 1/08* (2013.01); *H01L 31/022466* (2013.01); *G06F 2203/04103* (2013.01); *Y10T 428/265* (2015.01)

(58) Field of Classification Search
CPC ................ H01L 31/022466; H01L 31/1844; H01L 51/5215
USPC ............... 257/59; 428/336, 698; 204/192.17
See application file for complete search history.

(56) References Cited

U.S. PATENT DOCUMENTS 5,798,005 A * 8/1998 Murata et al. ............... 148/421
6,597,110 B1 * 7/2003 Thompson et al. ......... 313/506
(Continued)

FOREIGN PATENT DOCUMENTS

| KR | 100699072 B1 | 3/2007 |
|---|---|---|
| KR | 101260299 B1 | 5/2013 |

OTHER PUBLICATIONS

Fernandez et al, "applications of ZnO:Al deposited by RF sputtering to InN low-cost technology", Phys. Status Solidi A 207, 1717-1721 (2010).*

(Continued)

*Primary Examiner* — Cuong Q Nguyen
*Assistant Examiner* — Tong-Ho Kim
(74) *Attorney, Agent, or Firm* — Harness, Dickey & Pierce, P.L.C.

(57) ABSTRACT

Disclosed are a composite transparent electrode, a production method thereof, and an electronic device including the same, wherein the composite transparent electrode includes a metal nitride thin film including at least one of indium (In), titanium (Ti), zinc (Zn), zirconium (Zr), and gallium (Ga), and a metal oxide thin film including at least one of indium (In), zinc (Zn), tin (Sn), and titanium (Ti), the metal oxide thin film being formed on one surface or opposite surfaces of the metal nitride thin film.

16 Claims, 11 Drawing Sheets

(51) Int. Cl.
*C23C 14/02* (2006.01)
*C23C 14/06* (2006.01)
*C23C 14/08* (2006.01)
*H01B 1/00* (2006.01)
*H01B 1/08* (2006.01)

(56) References Cited

U.S. PATENT DOCUMENTS

2011/0084198 A1* 4/2011 McCabe et al. ....... 250/214 AL
2011/0129658 A1   6/2011 Hu et al.
2013/0040516 A1   2/2013 Pruneri et al.
2015/0022491 A1* 1/2015 Dumitru ............. G06F 3/03545
                                                    345/174

OTHER PUBLICATIONS

Joshua J. Robbins et al., "High mobility oxides: Engineered structures to overcome intrinsic performance limitations of transparent conducting oxides", Applied Physics Letters, Nov. 2003, pp. 3933-3935, vol. 83, No. 19, American Institute of Physics.

* cited by examiner

N₂/Ar = 0.1

N₂/Ar = 0.6

COMPOSITE TRANSPARENT ELECTRODES

CROSS-REFERENCE TO RELATED APPLICATION

This application claims priority from Korean Patent Application No. 10-2014-0000364, filed in the Korean Intellectual Property Office on Jan. 2, 2014, the entire contents of which are incorporated herein by reference.

BACKGROUND

1. Field

Example embodiments relate to composite transparent electrodes, production methods thereof, and electronic devices including the same.

2. Description of the Related Art

Electronic devices such as flat panel displays (e.g., a liquid crystal display and a light emitting diode display), touch screen panels, photovoltaic cells, and transparent transistors typically include transparent electrodes. Materials for the transparent electrode may be required to have high transmittance (e.g., of at least 80%) and low specific resistivity. The currently available materials for the transparent electrode typically include indium tin oxide (ITO), tin oxide ($SnO_2$), zinc oxide (ZnO), and the like. The ITO is an n-type semiconductor wherein the presence of $SnO_2$ may result in the generation of oxygen vacancies and electrons. Electrical and optical characteristics of the ITO may depend on defects in the crystalline structure of $In_2O_3$. The ITO tends to have poor flexibility, and limited reserves of indium may inevitably result in an increasing cost thereof so that it may be advantageous to develop a material that as a substitute to ITO. Tin oxides (e.g., $SnO_2$) are less expensive and chemically stable but may not be etched easily, their resistivity is higher than the resistivity of indium oxide and zinc oxide, and they may require a high process temperature. Zinc oxide is reported to have transmittance and electrical conductivity that are comparable to the transmittance and the electrical conductivity of ITO, but it is chemically unstable and may not provide a high etching ratio and a well-defined pattern when it is subjected to a wet etching process. In particular, electronic devices such as an organic light-emitting diode (OLED) may require a transparent electrode being prepared by vapor deposition at room temperature. However, most transparent electrodes including the aforementioned materials when deposited at room temperature tend to be amorphous or to have lower crystallinity, which may lead to lower conductivity and higher sheet resistance.

Therefore, it is desirable to develop an electrode material that may show high transmittance and enhanced conductivity even when formed by deposition at room temperature.

SUMMARY

Example embodiments of the present disclosure relate to a composite transparent electrode having high conductivity and high light transmittance even when deposited at room temperature.

Example embodiments of the present disclosure relate to a method of producing the composite transparent electrode.

Example embodiments of the present disclosure relate to an electronic device including the composite transparent electrode.

According to an example embodiment of the present disclosure, a composite transparent electrode includes a metal nitride thin film including at least one of indium (In), titanium (Ti), zinc (Zn), zirconium (Zr), and gallium (Ga), and a metal oxide thin film including at least one of indium (In), zinc (Zn), tin (Sn), and titanium (Ti), the metal oxide thin film being formed on one surface or on opposite surfaces of the metal nitride thin film.

The metal nitride thin film may include InN, TiN, or $Zn_3N_2$.

The thickness of the metal nitride thin film may be less than or equal to about 20 nm.

The metal oxide thin film may include a metal oxide being one of indium oxide ($In_2O_3$), zinc oxide (ZnO), tin oxide ($SnO_2$), indium tin oxide (ITO), indium zinc oxide (IZO), aluminum-doped zinc oxide (AZO), and a combination thereof.

The composite transparent electrode may have a sheet resistance of less than or equal to about 450 Ω/sq.

The composite transparent electrode may have a transmittance greater than or equal to about 75% with respect to light of a wavelength of about 550 nm.

The composite transparent electrode may have a carrier mobility of greater than or equal to about 9 $cm^2/V*S$, and a carrier concentration of greater than or equal to about $2 \times 10^{20}/cm^3$ when having thickness of 110 nm.

Another example embodiment of the present disclosure relates to a method of producing a composite transparent electrode that includes obtaining a substrate, conducting reactive sputtering or sputtering to form a first metal nitride thin film or a first metal oxide thin film on the substrate, and conducting sputtering to from a second metal oxide thin film on the first metal nitride thin film or conducting reactive sputtering to form a second metal nitride thin film on the first metal oxide thin film, wherein the first and second metal nitride thin films include at least one of indium (In), titanium (Ti), zinc (Zn), zirconium (Zr), and gallium (Ga), and the first and second metal oxide thin films include at least one of indium (In), zinc (Zn), tin (Sn), and titanium (Ti).

The method may further include forming a third metal oxide thin film including at least one of indium (In), zinc (Zn), tin (Sn), and titanium (Ti) on the second metal nitride thin film.

The sputtering and/or the reactive sputtering may be conducted at a temperature of less than or equal to about 30° C.

The reactive sputtering may be conducted in the presence of a sputtering gas including nitrogen gas and an inert gas.

The inert gas may include argon (Ar), helium (He), neon (Ne), krypton (Kr), or a combination thereof.

The sputtering gas may have a volume ratio of the nitrogen gas to the inert gas ($N_2$/the inert gas) of greater than or equal to about 0.1.

Another example embodiment of the present disclosure relates to an electronic device including a composite transparent electrode having a metal nitride thin film including at least one of indium (In), titanium (Ti), zinc (Zn), zirconium (Zr), and gallium (Ga), and a metal oxide thin film including at least one of indium (In), zinc (Zn), tin (Sn), and titanium (Ti), the metal oxide thin film being formed on one surface or on opposite surfaces of the metal nitride thin film.

The electronic device may be a flat panel display, a touch screen panel, a photovoltaic cell, an e-window, a heat mirror, a transparent transistor, or a flexible display.

According to example embodiments, it becomes possible to provide a composite transparent electrode having enhanced light transmittance to visible light while maintaining high conductivity. The composite transparent electrode may have conductivity and transmittance comparable to ITO, and may be prepared by deposition at room temperature. Therefore, it holds a greater potential to be used as a transparent conductive electrode (TCE).

DETAILED DESCRIPTION

Figure 1:
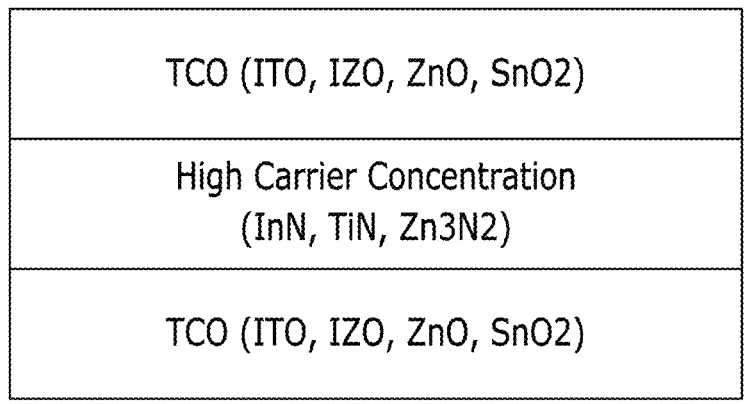
FIG. 1 is a view schematically illustrating a cross-sectional view of a composite electrode in accordance with an example embodiment.

Advantages and characteristics of this disclosure, and a method for achieving the same, will become evident referring to the following example embodiments together with the drawings attached hereto. However, this disclosure may be embodied in many different forms and is not to be construed as limited to the example embodiments set forth herein; rather, these example embodiments are provided so that this disclosure will satisfy applicable legal requirements. Therefore, in some example embodiments, well-known process technologies are not explained in detail in order to avoid vague interpretation of the present disclosure. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Further, the singular includes the plural unless otherwise mentioned.

According to at least one example embodiment, a composite transparent electrode includes a metal nitride thin film including at least one of indium (In), titanium (Ti), zinc (Zn), zirconium (Zr), and gallium (Ga), and a metal oxide thin film including at least one of indium (In), zinc (Zn), tin (Sn), and titanium (Ti), the metal oxide thin film being formed on one surface or on opposite surfaces of the metal nitride thin film.

The metal nitride thin film may include InN, TiN, or $Zn_3N_2$.

The metal nitride including at least one of indium (In), titanium (Ti), zinc (Zn), zirconium (Zr), and gallium (Ga) may be prepared as a thin film via reactive sputtering, and the resulting thin film may have a high carrier concentration (e.g., $5 \times 10^{20}/cm^3$) depending on a sputtering gas composition (e.g., the ratio between nitrogen and argon). In light of the transparency of the composite electrode (e.g., total light transmittance of the composite electrode), the metal nitride thin film may have a thickness of less than or equal to about 20 nm, for example, about 5 nm to about 15 nm.

In some example embodiments, the metal nitride may be a titanium-based nitride (or zirconium-based nitride) having a heterometal element such as one of zinc (Zn), gallium (Ga), indium (In), and a combination thereof, which is formed by adding and/or substituting $Zn_3N_2$, GaN, or InN to a titanium nitride (or a zirconium-based nitride). Without wishing to be bound by any theory, it is believed that even though such addition and/or substitution may cause a change in carrier concentration of the resulting material, the addition and/or substitution may increase the carrier mobility or the bandgap, and thereby the resulting material may have higher transmittance while maintaining its high conductivity.

The metal nitride may be formed by reactive sputtering or reactive co-sputtering.

As mentioned above, the metal nitride having the high carrier concentration may be laminated with a metal oxide thin film to form a composite and the resulting composite may exhibit high carrier concentration and high carrier mobility together, while having low sheet resistance and enhanced conductivity.

The metal oxide may be an oxide including at least one of indium (In), zinc (Zn), tin (Sn), and titanium (Ti). For example, the metal oxide may be an indium oxide ($In_2O_3$), a zinc oxide (ZnO), a tin oxide ($SnO_2$), or a combination thereof. In addition, the metal oxide such as an indium oxide ($In_2O_3$), a zinc oxide (ZnO), or a tin oxide ($SnO_2$) may be doped with a heteroatom such as boron, aluminum, gallium, indium, or tin, or a halogen element, and/or it may form a solid solution together with an oxide of the heteroatom. The amount of the doping heteroatom or element, or the oxide forming the solid solution, is not particularly limited and may be selected appropriately in light of the conductivity and the light transmittance. For example, the metal oxide may be an indium tin oxide (ITO), an indium zinc oxide (IZO), or an aluminum zinc oxide (AZO). In non-limiting examples, the ITO may be a solid solution including an indium oxide ($In_2O_3$) and a tin oxide ($SnO_2$), wherein the amount of the indium oxide is greater than or equal to about 90% by weight and the amount of the tin oxide is less than or equal to about 10% by weight, and the ITO may have a high level of light transmittance and low electrical resistivity. The aforementioned metal oxide may be prepared as a thin film via any known method such as physical vapor deposition (e.g., sputtering), chemical vapor deposition, or the like.

The aforementioned composite transparent electrode may have enhanced electrical conductivity, even in comparison with the electrical conductivity of the ITO being typically used in the art. For example, when its thickness is about 110 nm, the composite transparent electrode may have a sheet resistance of less than about 450 Ω/sq, for example, less than or equal to about 310 Ω/sq, less than or equal to about 250 Ω/sq, or less than or equal to about 200 Ω/sq. The composite transparent electrode may have a high light transmittance (comparable to the light transmittance of ITO being typically used in the art). For example, when its thickness is about 110 nm, the composite transparent electrode may have a transmittance of greater than or equal to about 75%, for example, greater than or equal to about 80%, or greater than or equal to about 85%, with respect to light having a wavelength of about 550 nm.

The composite transparent electrode may have a higher carrier concentration than the carrier concentration of the metal oxide included therein while maintaining carrier mobility at a satisfactory level. The thickness of the composite transparent electrode is not particularly limited, but may be selected appropriately depending on its final use. For example, in order to be used in a flat panel display, the composite transparent electrode may have a thickness of, for example, less than or equal to about 200 nm, but it is not limited thereto. By way of another example, in order to be used in a solar cell, the thickness of the composite transparent electrode may range, for example, from about 0.5 μm to about 1.5 μm, but it is not limited thereto.

FIG. 1 shows a non-limiting example of the aforementioned composite transparent electrode. Referring to FIG. 1, the metal nitride thin film is disposed between the metal oxide thin films, and thus the resulting composite transparent electrode has a (sandwich) structure of metal oxide-metal nitride-metal oxide. In other example embodiments, the composite transparent electrode may have a laminated structure of a metal nitride thin film-a metal oxide thin film. In another example embodiment, the composite transparent electrode may have an alternatingly-laminated structure of a metal nitride thin film and a metal oxide film. By way of example, the composite metal oxide may have a laminated structure of metal oxide thin film-metal nitride thin film-metal oxide thin film-metal nitride thin film, a laminated structure of metal oxide thin film-metal nitride thin film-metal oxide thin film-metal nitride thin film-metal oxide thin film, or the like.

In another example embodiment, the method of producing a composite transparent electrode includes obtaining a substrate, forming a first metal nitride thin layer (hereinafter also referred to as a thin film) or a first metal oxide thin layer via reactive sputtering or sputtering, and either forming a second metal oxide thin layer on the first metal nitride thin layer via sputtering or forming a second metal nitride thin layer on the first metal oxide thin layer via reactive sputtering, wherein the first metal nitride thin layer and the second metal nitride thin layer include at least one of indium (In), titanium (Ti), zinc (Zn), zirconium (Zr), and gallium (Ga), and the first metal oxide thin layer and the second metal oxide thin layer include at least one of indium (In), zinc (Zn), tin (Sn), and titanium (Ti).

The method may further include forming a third metal oxide thin layer including at least one of indium (In), zinc (Zn), tin (Sn), and titanium (Ti) on the second metal nitride thin layer.

Details of the metal oxide and the metal nitride are the same as set forth above.

According to at least one example embodiment, the reactive sputtering and the sputtering may be conducted in any sputtering apparatus that is known or commercially available in the art. A temperature for the reactive sputtering and the sputtering may be controlled appropriately and is not particularly limited. In non-limiting examples, the reactive sputtering and/or the sputtering may be conducted at a temperature of less than or equal to about 30° C. The composite transparent electrode may have low sheet resistance and high conductivity even when deposited at room temperature.

In some example embodiments, the metal nitride thin film may be formed on the substrate or on the metal oxide thin film via the reactive sputtering. The reactive sputtering may be conducted in the presence of a sputtering gas including nitrogen gas and an inert gas. When the metal nitride includes at least two metals, reactive co-sputtering may be conducted with metal targets for each of the at least two metals. As the sputtering apparatus, it is possible to use any known apparatus for the reactive sputtering. For example, it is possible to use a magnetron sputtering apparatus equipped with a radio-frequency (RF) and/or a direct-current (DC) power supply (e.g., a sputtering apparatus having a model name of SHS-2M-3-400TL manufactured by Samhan Vacuum Co., Ltd.), but it is not limited thereto. Such apparatus is commercially available.

The inert gas may include argon (Ar), helium (He), neon (Ne), krypton (Kr), or a combination thereof. The ratio of the nitrogen gas to the inert gas in the sputtering gas (for example, $N_2/Ar$ when using argon as the inert gas) may be greater than or equal to about 0.1, for example greater than or equal to about 0.2, greater than or equal to about 0.3, or greater than or equal to about 0.4. The ratio of the nitrogen gas to the inert gas in the sputtering gas (for example, $N_2/Ar$ when using argon as the inert gas) may be less than or equal to about 1, for example, less than or equal to about 0.6.

Materials and shapes of the substrate are not particularly limited, but may be selected appropriately. For example, the substrate may include an inorganic oxide, quartz, a resin such as polystyrene, polycarbonate, polyolefin, polyethylene terephthalate, polyimide, and the like, a semiconductor such as Si, Ga, and the like, or a crystalline material such as a monocrystalline or a polycrystalline material, but it is not limited thereto. The substrate may have any shape.

Figure 2:
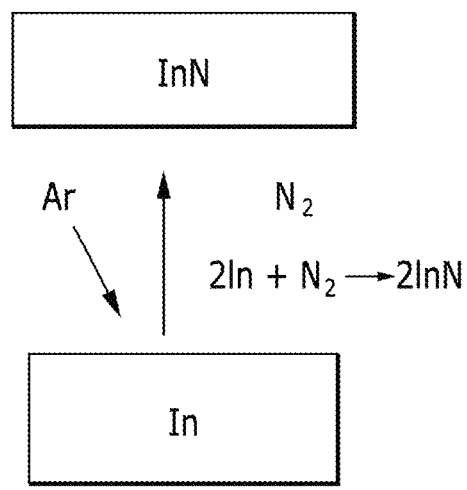
FIG. 2 is a view schematically illustrating a process of forming a thin film of InN, according to at least one example embodiment.
Figure 3:
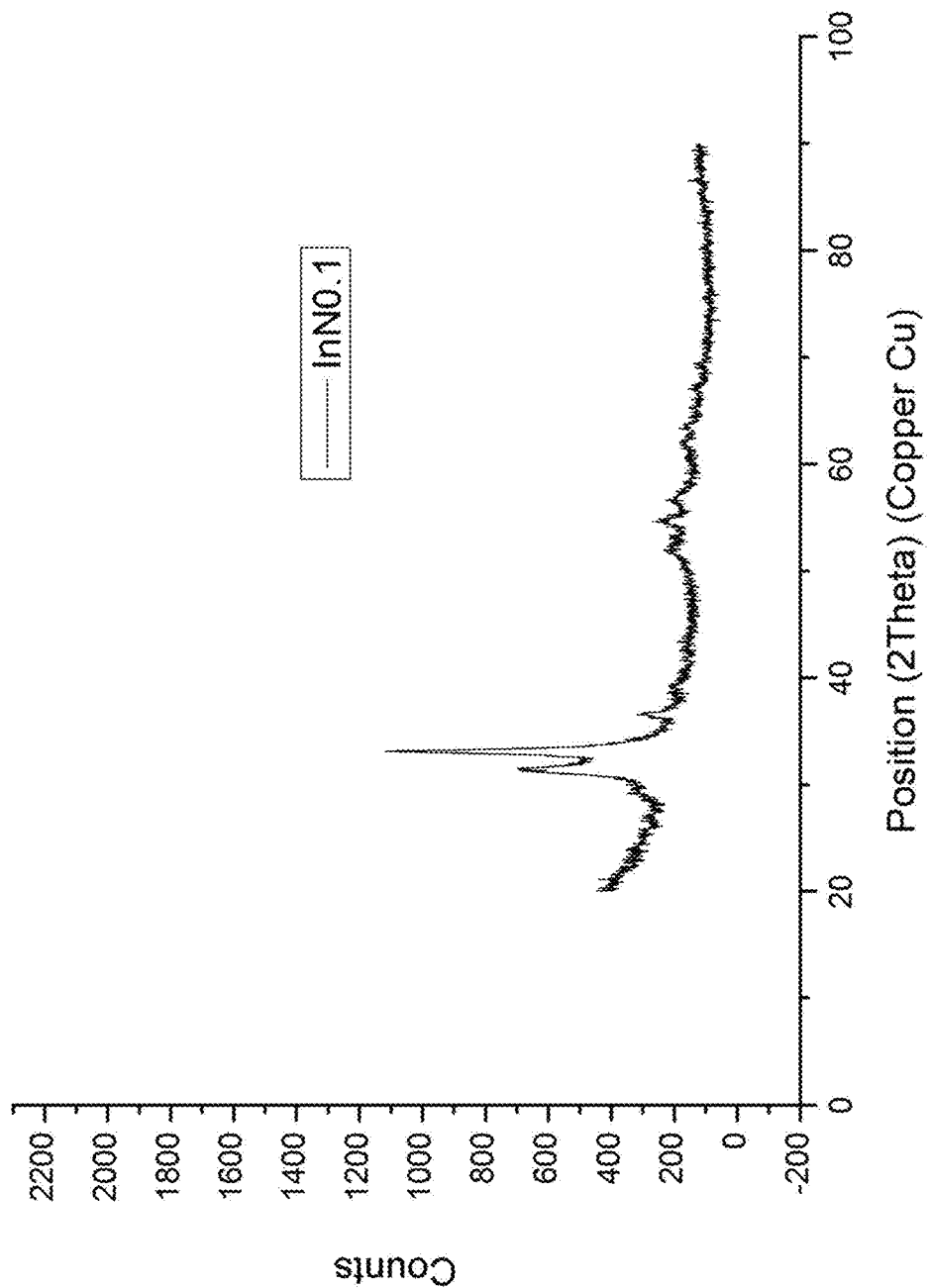
FIGS. 3 to 6 include X-Ray diffraction (XRD) spectrums of thin films prepared in Reference Examples 1, 2, 4, and 5, respectively, according to at least one example embodiment.
Figure 4:
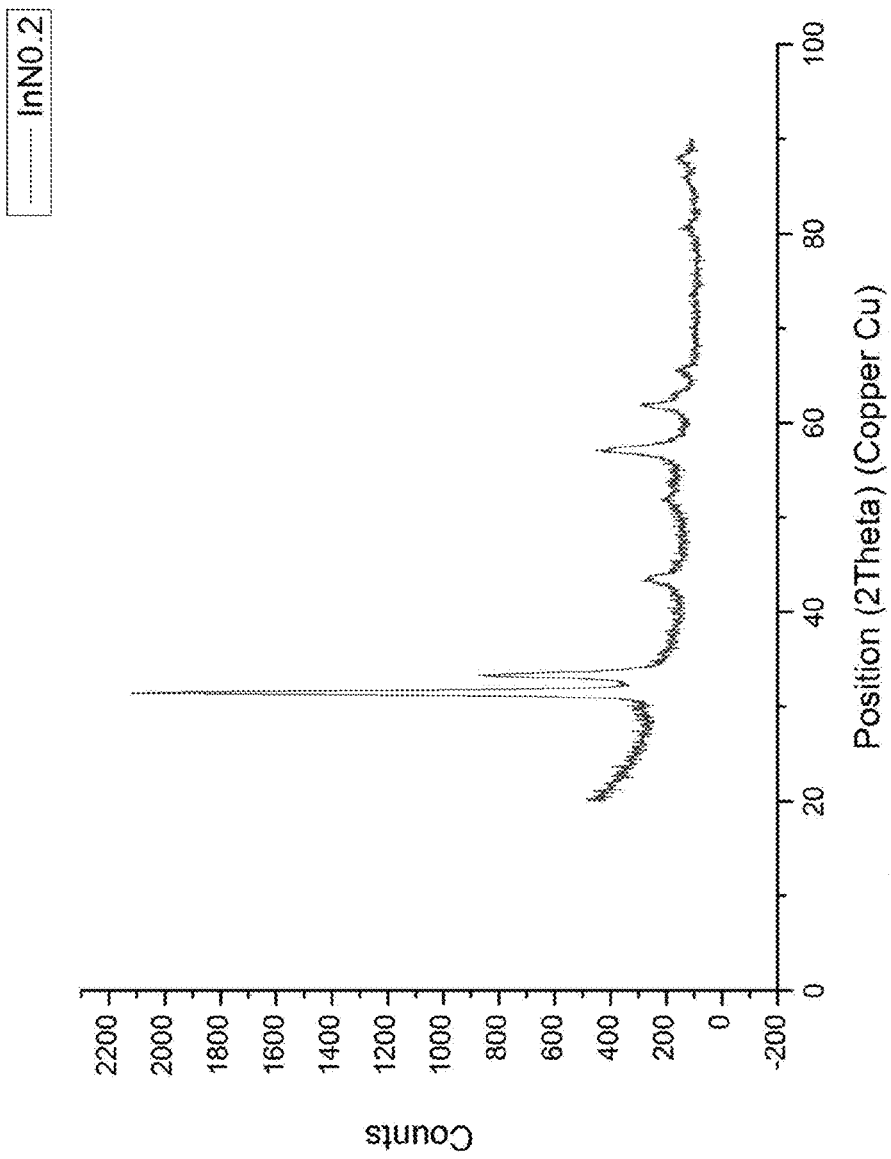
Figure 5:
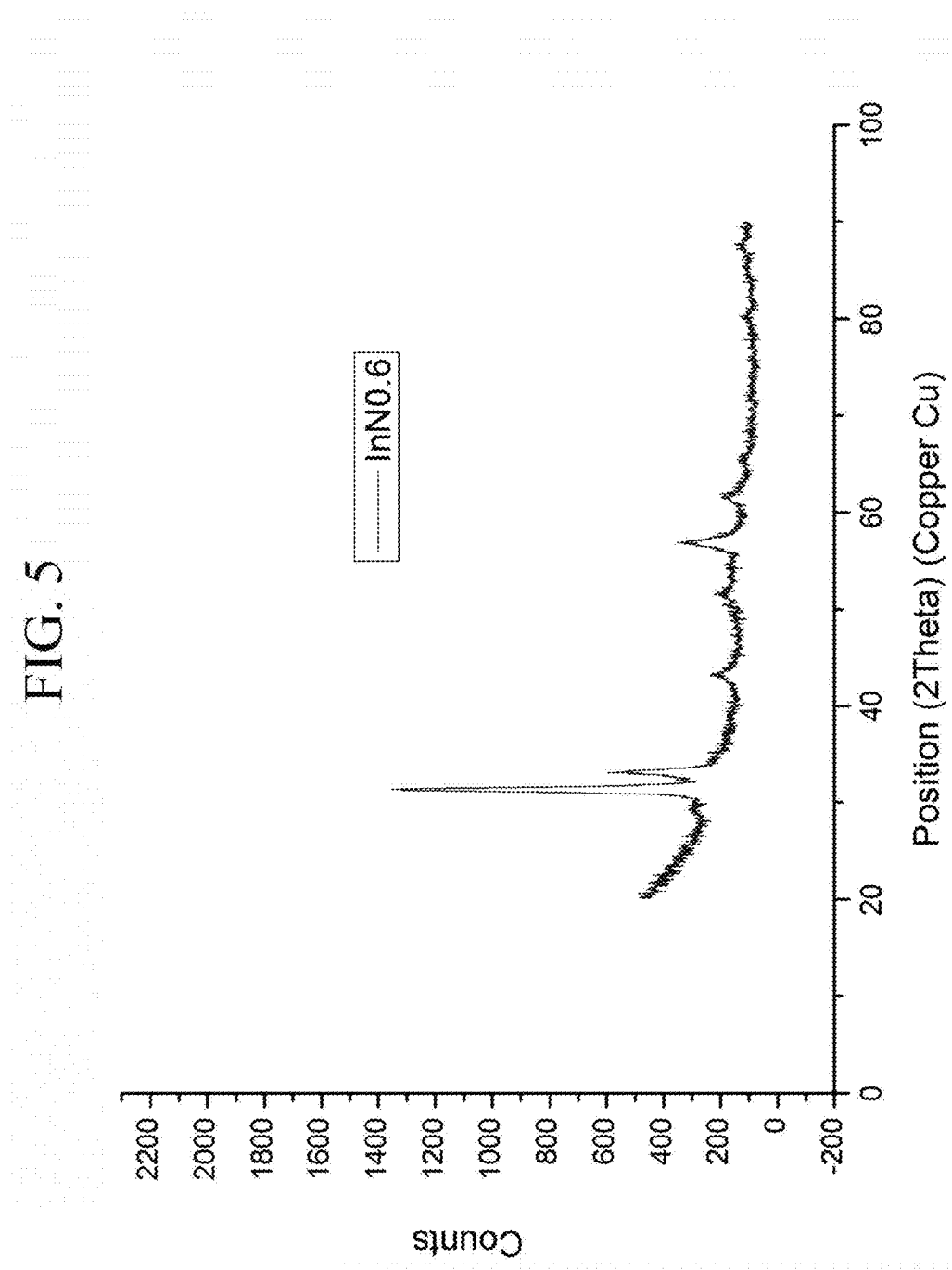
Figure 6:
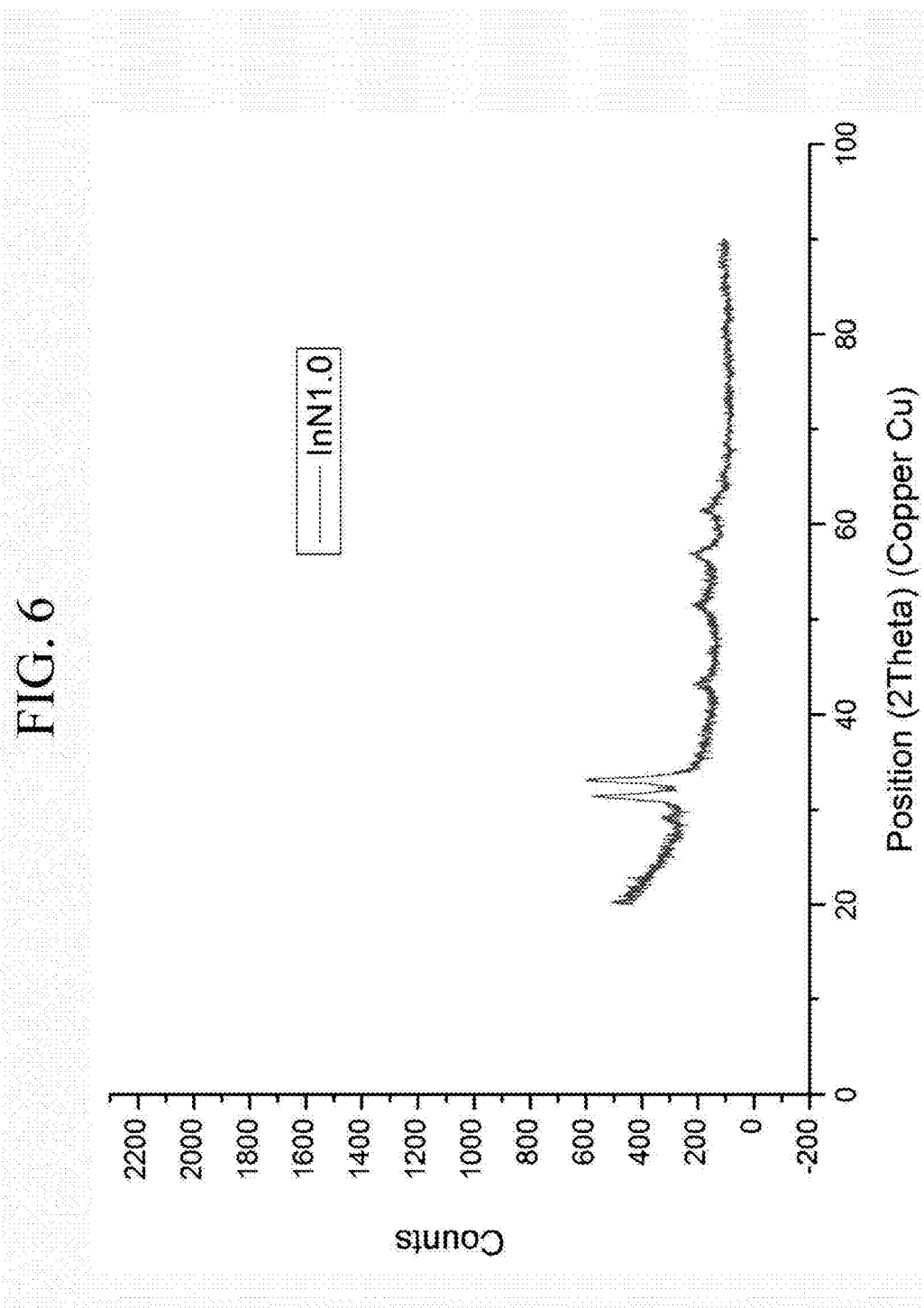

Conditions for sputtering may be controlled appropriately so as to form a metal nitride having a desired composition. In non-limiting examples, referring to FIG. 2, a target for the metal to be deposited (e.g., an indium metal) is sputtered in the presence of a sputtering gas including nitrogen and an inert gas, and thereby the metal (e.g., indium) reacts with the nitrogen to form a metal nitride (e.g., InN) thin film on a substrate. When co-sputtering is carried out, at least two metal targets may be used. For example, a voltage is applied to the Ti (or Zr) metal target and the heterometal (other than Ti and Zr) nitride target under an atmosphere including nitrogen and argon to form a thin film of a titanium- (or zirconium-)based nitride including a desired amount of the heterometal element. In this case, the following procedures may be carried out for controlling the composition in the resulting nitride (e.g., a stoichiometric amount of each element): sputtering conditions such as power, time, and vacuum degree are determined depending on the thickness with respect to TiN (or ZrN) and the heterometal nitride. From the density of each nitride as measured, the atomic percentage (at %) of each element is calculated, and then the sputtering conditions may be determined to form a thin film of a compound having a desired composition. The metal target such as the indium metal target, the Zr metal target, the Ti metal target, and the heterometal nitride target may be produced in any known method, or is commercially available.

The manners of applying the voltage are not particularly limited and may be selected appropriately. For example, RF or DC power may be applied to the indium metal target. When the metal nitride including at least two metals is to be deposited, DC power may be used for a metal target (e.g., a Ti or Zr target), and RF power may be used for the heterometal nitride target. The sputtering temperature is not particularly limited, and the sputtering may be carried out at a temperature of less than or equal to about 100° C. (even at room temperature). The distance between the target and a substrate is not particularly limited, and may be greater than or equal to about 1 cm, for example, may range from 1 cm to 30 cm. The sputtering time may be 5 min or longer, but is not limited thereto. The thickness of the thin film may be controlled by adjusting the sputtering time.

In some example embodiments, the metal oxide thin film may be formed on the substrate or on the metal nitride thin film. The methods of forming the metal oxide thin film are not particularly limited and it is possible to use any known methods (e.g., physical vapor deposition, chemical vapor deposition, or the like). For example, the metal oxide thin film may be formed via sputtering. As to the sputtering of the metal oxide thin film, the selections of the metal and the conditions for the sputtering are known in the art. For example, in case of the thin film of the indium oxide, the tin oxide, or the zinc oxide, it is possible to use an oxide target having the same composition as the final oxide of the thin film. In addition, in case of the thin film of the indium thin oxide (ITO), the indium zinc oxide (IZO), and the aluminum zinc oxide (AZO), it is possible to use an oxide target having the same composition as the final oxide of the thin film. Any known or commercially available sputtering apparatus may be used for the sputtering of the metal oxide thin film. The sputtering may be carried out using any power (e.g., DC and/or RF power) in the presence of an inert gas. The inert gas may include argon (Ar), helium (He), neon (Ne), krypton (Kr), or a combination thereof, and for example, may include argon. The sputtering temperature is not particularly limited, and the sputtering may be carried out at a temperature of less than or equal to about 100° C. (even at room temperature). The distance between the target and a substrate is not particularly limited, and may be greater than or equal to about 1 cm, for example, may range from 30 cm to 50 cm. The sputtering time may be 1 min or longer, but is not limited thereto. The thickness of the thin film may be controlled by adjusting the sputtering time.

The metal nitride thin film and/or the metal oxide thin film may be subjected to a post-annealing process under an inert gas atmosphere and/or under high vacuum. The temperature of the post-annealing process is not particularly limited, and may range from about 100° C. to about 500° C., for example, from about 200° C. to about 500° C.

In other example embodiments, an electronic device including a transparent conductive thin film includes a composite transparent electrode including a metal nitride thin film including at least one of indium (In), titanium (Ti), zinc (Zn), zirconium (Zr), and gallium (Ga), and a metal oxide thin film including at least one of indium (In), zinc (Zn), tin (Sn), and titanium (Ti), the metal oxide thin film being formed on one surface or on opposite surfaces of the metal nitride thin film.

Details of the composite transparent electrode have already been explained above. The electronic device may be a flat panel display, a touch screen panel, a photovoltaic cell, an e-window, a heat mirror, a transparent transistor, or a flexible display.

The following examples illustrate one example embodiment in more detail. However, it is understood that the scope of the example embodiment is not limited to these examples.

EXAMPLES

Reference Examples 1 to 5

Formation of an InN Thin Film by Reactive Sputtering

An InN thin film is formed using an indium metal target and a mixture of nitrogen ($N_2$) gas and argon (Ar) gas as a sputtering gas under the following conditions.

Sputtering apparatus: magnetron sputter (manufactured by Samhan Vacuum Co. Ltd., model name: SHS-2M-3-400TL)

Substrate: Si substrate (for measurement of conductivity)/ E-glass (for measurement of transmittance)

Power: RF 40 W

Time: 2 min

Temperature: room temperature

In metal target: purity 99.995% (from LTS Chemical)

In the sputtering apparatus, the In metal target is mounted and the chamber is decompressed to $5\times10^{-5}$ Pa using a vacuum pump. Then, a predetermined, or alternatively desired, volume of argon gas (e.g., 50 sccm) and a predetermined, or alternatively desired, volume of nitrogen gas (e.g., 5, 10, 20, or 30 sccm) are supplied to the apparatus such that the volume ratio of $N_2/Ar$ is the same as set forth in Table 1. Sputtering is conducted for 2 minutes by applying a voltage to the target to provide a thin film having a thickness of 10 nm.

TABLE 1

| Reference Example | $N_2/Ar$ ratio | Specific resistance ($10^{-3}$ ohm/cm) | Carrier mobility $cm^2/V * s$ | Carrier concentration $10^{20}/cm^3$ |
|---|---|---|---|---|
| 1 | 0.1 | 0.4 | 0.679 | 220 |
| 2 | 0.2 | 2.0 | 2.68 | 11.7 |
| 3 | 0.4 | 2.9 | 3.96 | 9 |
| 4 | 0.6 | 4.7 | 1.87 | 7.0 |
| 5 | 1.0 | 14.7 | 1.07 | 3.9 |

An X-ray diffraction analysis is made for each of the thin films obtained in Reference Examples 1, 2, 4, and 5, and the results are shown in FIGS. 3 to 6. In addition, for each of the thin films, specific resistivity, carrier mobility, and carrier concentration are measured using a Hall effect apparatus (Nanometrics, HL5500PC), and the results are compiled in Table 1.

It is confirmed that the carrier mobilities of the prepared thin films are not particularly high, but the carrier concentrations thereof are very high and are greater than or equal to about $5\times10^{20}/cm^3$. Such a level of the carrier concentration is significantly higher than the carrier concentration of the ITO and IZO.

Figure 7:
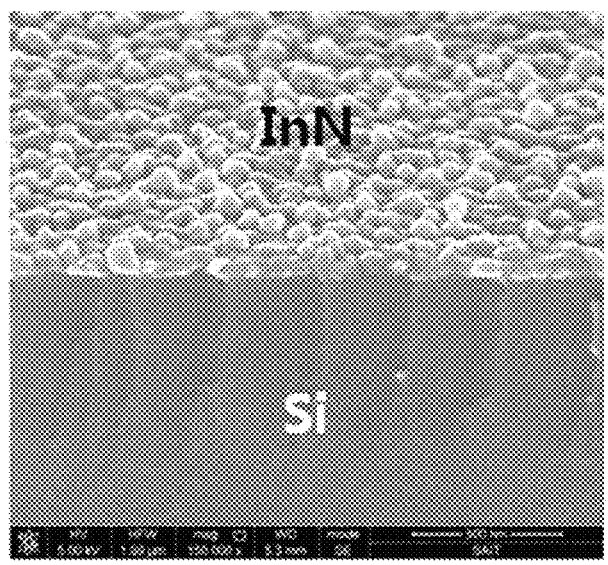
FIGS. 7 to 9 include scanning electron microscopy (SEM) images of thin films prepared in Reference Examples 1, 2, and 4, respectively, according to at least one example embodiment.
Figure 8:
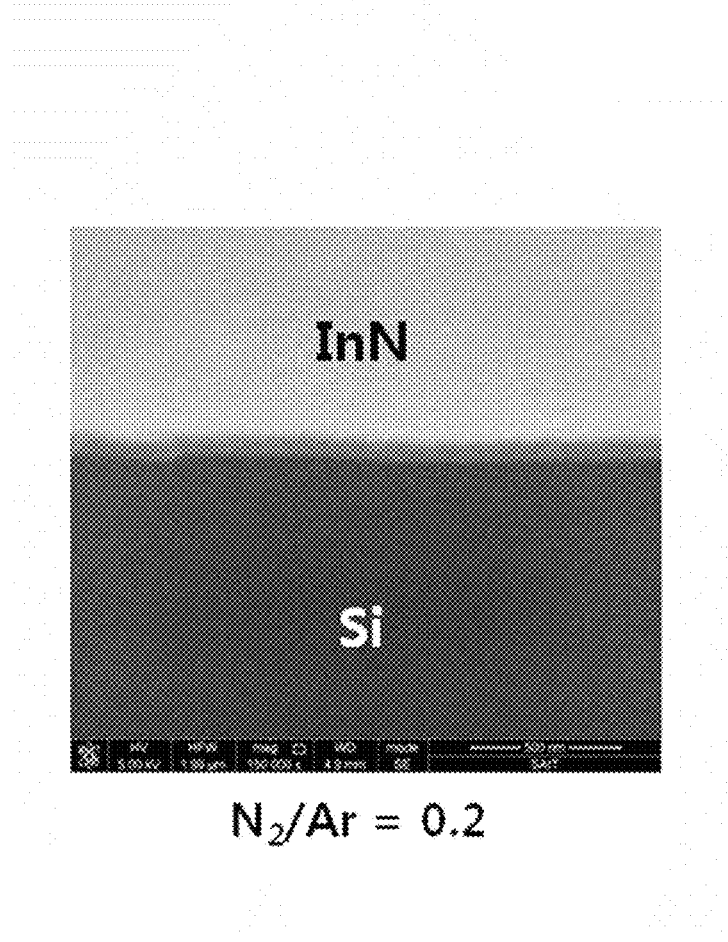
Figure 9:
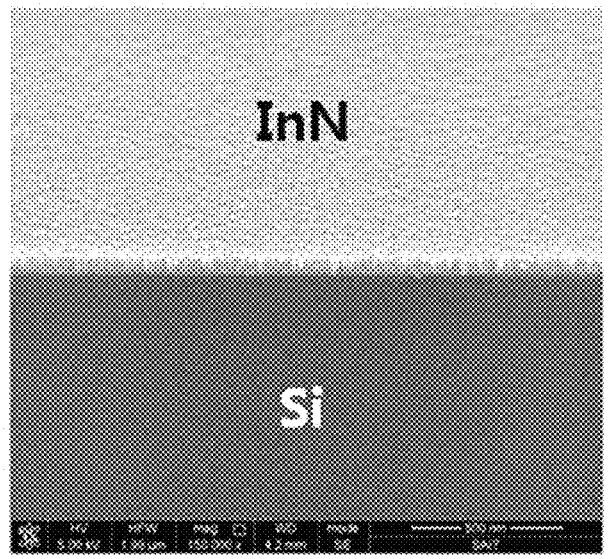

As to the thin films obtained from Reference Examples 1, 2, and 4, surface microstructures are observed using a scanning electronic microscope, and the results are shown in FIGS. 7 to 9. The results of FIGS. 7 to 9 confirm that when the ratio of nitrogen/argon is 0.1, the thin film has a rough surface and large grains are observed thereon, while when the ratio of nitrogen/argon is greater than or equal to 0.2, the thin film has a dense surface and fine grains are formed thereon. The dense microstructure of the thin film may have an advantageous effect on the conductivity and the transparency.

Reference Example 6

Formation of TiN Thin Film Via Reactive Sputtering

A TiN thin film is formed using a titanium metal target and a mixture of nitrogen ($N_2$) gas and argon (Ar) gas as a sputtering gas under the following conditions.

Sputtering apparatus: magnetron sputter (manufactured by Samhan Vacuum Co. Ltd., model name: SHS-2M-3-400TL)

Substrate: Si substrate (for measurement of conductivity)/ E-glass (for measurement of transmittance)

Power: 50 W

Time: 5 min

Temperature: room temperature

Ti metal target: purity 99.999% (from LTS Chemical)

In the sputtering apparatus, the Ti metal target is mounted and the chamber is decompressed to $5\times10^{-5}$ Pa using a vacuum pump. Then, a predetermined, or alternatively desired, volume of argon gas and a predetermined, or alternatively desired, volume of nitrogen gas are supplied to the apparatus such that the volume ratio of $N_2/Ar$ is the same as set forth in Table 2. Sputtering is conducted for 5 minutes by applying a voltage to the target to provide a thin film having a thickness of 50 nm.

Figure 10:
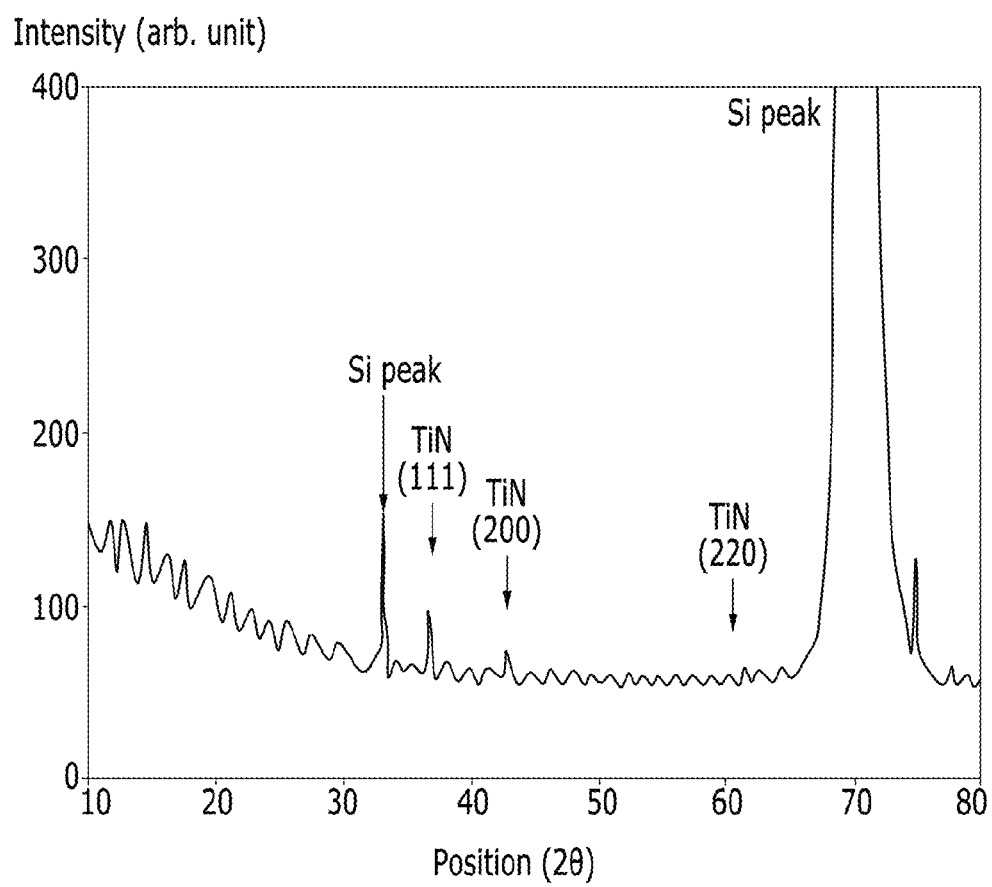
FIG. 10 shows an XRD spectrum of a thin film prepared in Reference Example 6, according to at least one example embodiment.
Figure 11:
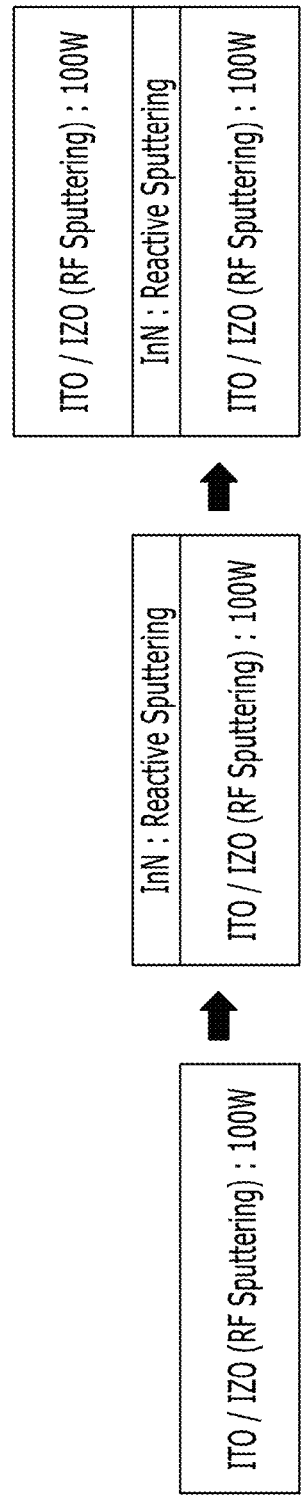
FIG. 11 is a view schematically illustrating a process of preparing a composite electrode in Examples 1 to 3, according to at least one example embodiment.

An X-ray diffraction analysis is made for each of the obtained thin films, and the results are shown in FIG. 10. In addition, for each of the thin films, specific resistivity is measured in the same manner as set forth in Reference Examples 1 to 5, and the results are compiled in Table 2.

TABLE 2

| $N_2/Ar$ ratio | Specific resistance ($\times10^{-4}$ ohm * cm) | Thickness (nm) |
|---|---|---|
| 0.1 | 4.5 | 50 |
| 0.2 | 20 | 50 |
| 0.4 | 92 | 50 |
| 0.6 | 540 | 50 |

The results of Table 2 confirm that the obtained TiN thin films have different values of conductivity depending on the ratio of $N_2/Ar$ on sputtering. Referring to the results of Table 2, as the ratio of $N_2/Ar$ decreases, the specific resistivity also decreases. With reference to FIG. 10, the main peaks of TiN are located at (111), (200), and (220), and when the ratio of $N_2/Ar$ is at least 0.1, a peak at (111) is observed to confirm the formation of crystalline TiN.

Example 1

ITO/InN/ITO (1) Formation of a First ITO Thin Film

An indium tin oxide (ITO) layer having a thickness of 50 nm is formed on a Si substrate by conducting sputtering using an ITO target as a sputtering target, and argon (Ar) gas (50 sccm) as a sputtering gas under the following conditions.

Substrate: Si substrate (for measurement of conductivity)/ E-glass (for measurement of transmittance)
Power: DC 100 W
Time: 10 min
Target: ITO/99.95% (manufactured by LTS chemical)
(2) Formation of an InN Thin Film An indium nitride layer having a thickness of 10 nm is formed on the indium thin oxide layer formed in item (1) by conducting reactive sputtering under the same conditions recited in Reference Example 2.

(3) Formation of a Second ITO Thin Film

An indium tin oxide layer having a thickness of 50 nm is formed on the indium nitride layer formed in the item (2) in the same manner as set forth in item (1), and thereby, a composite electrode of ITO/InN/ITO having a total thickness of 110 nm is obtained.

Comparative Example 1

An ITO thin film having a thickness of 110 nm is formed on a Si substrate by conducting a sputtering process, which is the same as set forth in Example 1.

Example 2

IZO/InN/IZO (1) Formation of a First IZO Thin Film

An indium zinc oxide (IZO) layer having a thickness of 90 nm is formed on a Si substrate by conducting sputtering using an IZO target (ZnO: 10 wt %) as a sputtering target, and an argon (Ar) gas (50 sccm) as a sputtering gas under the following conditions.

Substrate: Si substrate (for measurement of conductivity)/ E-glass (for measurement of transmittance)
Power: DC 100 W
Time: 10 min
Target: IZO/99.95% (manufactured by LTS chemical)
(2) Formation of an InN Thin Film An indium nitride layer having a thickness of 10 nm is formed on the indium thin oxide layer formed in item (1) by conducting reactive sputtering under the same conditions recited in Reference Example 2.

(3) Formation of a Second IZO Thin Film

An indium zinc oxide layer having a thickness of 90 nm is formed on the indium nitride layer formed in the item (2) in the same manner as set forth in item (1), and thereby, a composite electrode of IZO/InN/IZO having a total thickness of 190 nm is obtained.

Comparative Example 2

An IZO thin film having a thickness of 190 nm is formed on a Si substrate by conducting a sputtering process in the same manner as set forth in item (1) of Example 2.

Example 3

IZO/InN/IZO (100 nm)

An IZO/InN/IZO composite thin film having a thickness of 100 nm is formed by conducting a sputtering process in the same manner as set forth in Example 2, except that the first IZO thin film and the second IZO thin film are formed to have a thickness of 45 nm and 45 nm, respectively.

Comparative Example 3

An IZO thin film having a thickness of 100 nm is formed on a Si substrate by conducting a sputtering process in the same manner as set forth in item (1) of Example 2.

Example 4

An ITO/InN/ITO composite electrode is formed by conducting a sputtering process in the same manner as set forth in Example 1, except that the first ITO thin film and the second ITO thin film are formed to have a sum of thicknesses of 105 nm and the InN thin film is formed to have a thickness of 5 nm.

Example 5

An ITO/InN/ITO composite electrode is prepared in the same manner as set forth in Example 1, except that the first ITO thin film and the second ITO thin film are formed to have a sum of thicknesses of 95 nm and the InN layer is formed to have a thickness of 15 nm.

Example 6

An ITO/InN/ITO composite electrode is prepared in the same manner as set forth in Example 1, except that the first ITO thin film and the second ITO thin film are formed to have a sum of thicknesses of 90 nm and the InN layer is formed to have a thickness of 20 nm.

Experimental Example 1

Evaluation of Electrical Properties of the Composite Transparent Electrode

Sheet resistance, carrier concentration, and carrier mobility are measured for the transparent electrodes of Examples 1 to 3 and Comparative Examples 1 to 3, and the results are shown in Table 3.

(1) Sheet resistance is measured using Hall effect apparatus (Nanometrics, HL5500 PC).
(2) Carrier concentration is measured using Hall effect apparatus (Nanometrics, HL5500 PC).
(3) Carrier mobility is measured using Hall effect apparatus (Nanometrics, HL5500 PC).
(4) Light transmittance is measured using a measuring device for transmittance and haze (Nippon Denshoku, NDH-5000).

TABLE 3

| | Composition | Thickness (nm) | Sheet resistance ($\Omega$/sq) | Specific resistance ($10^{-3}$ ohm/cm) | Carrier concentration ($\times 10^{20}$/cm$^3$) | Carrier mobility (cm$^2$/V * S) | Transmittance (%) |
|---|---|---|---|---|---|---|---|
| Example 1 | ITO/InN/ITO | 110 | 210 | 2.4 | 2.9 | 9.2 | 96% |
| Comp. Example 1 | ITO | 110 | 450 | 4.9 | 0.94 | 13.6 | 94% |

TABLE 3-continued

| | Composition | Thickness (nm) | Sheet resistance (Ω/sq) | Specific resistance ($10^{-3}$ ohm/cm) | Carrier concentration ($\times 10^{20}$/cm$^3$) | Carrier mobility (cm$^2$/V * S) | Transmittance (%) |
|---|---|---|---|---|---|---|---|
| Example 2 | IZO/InN/IZO | 190 | 40 | 0.8 | 3.4 | 23 | 86% |
| Comp. Example 2 | IZO | 190 | 71 | 1.4 | 1.7 | 26.2 | 90% |
| Example 3 | IZO/InN/IZO | 100 | 82 | | 3.8 | 21 | |
| Comp. Example 3 | IZO | 100 | 120 | | 2.6 | 23.6 | |

The results of Table 3 confirm that sheet resistance and specific resistance of the composite electrodes are about two-thirds or half the sheet resistance and specific resistance of the electrodes including metal oxides only. In addition, the composite electrodes thus prepared have lower carrier concentrations than the carrier concentrations of the metal oxide electrode, but they have total carrier concentrations that are significantly increased. In addition, the composite electrode may exhibit a light transmittance that is comparable to the light transmittance of the metal oxide electrode.

Experimental Example 2

Evaluation of Electrical Properties of the Composite Electrode Depending on the Total Thickness of the Metal Nitride Sheet resistance and light transmittance are measured in the same manner as in Experimental Example 1 for the composite electrodes of Examples 1, 4, 5, and 6 and Comparative Example 1. The results are compiled in Table 4.

TABLE 4

| | Composition | Thickness | Sheet resistance (Ω/sq) | Transmittance (%) |
|---|---|---|---|---|
| Comparative Example 1 | ITO | 110 nm | 450 | 90% |
| Example 1 | ITO/InN/ITO | 110 nm (InN: 5 nm) | 300 | 91% |
| Example 4 | ITO/InN/ITO | 110 nm (InN: 10 nm) | 210 | 89% |
| Example 5 | ITO/InN/ITO | 110 nm (InN: 15 nm) | 200 | 85% |
| Example 6 | ITO/InN/ITO | 110 nm (InN: 20 nm) | 180 | 75% |

The sheet resistance and transmittance of the composite electrode may vary with the thickness of the InN in the composite. For example, when the thickness of InN is 5 to 15 nm, the composite electrodes may have a transmittance of greater than or equal to about 85% and a substantially reduced sheet resistance.

While this disclosure has been described in connection with what is presently considered to be practical example embodiments, it is to be understood that the invention is not limited to the disclosed example embodiments, but, on the contrary, is intended to cover various modifications and equivalent arrangements included within the spirit and scope of the appended claims.

What is claimed is:

1. A composite transparent electrode comprising:
   a metal nitride thin film including at least one of indium (In), zinc (Zn), and gallium (Ga); and
   two metal oxide thin films, each of the two metal thin films consisting of indium oxide ($In_2O_3$), zinc oxide (ZnO), tin oxide ($SnO_2$), indium tin oxide (ITO), indium zinc oxide (IZO), aluminum doped zinc oxide (AZO), or a combination thereof, each of the two metal oxide thin films being on opposite surfaces of the metal nitride thin film, respectively.

2. The composite transparent electrode of claim 1, wherein the metal nitride thin film comprises at least one of InN and $Zn_3N_2$.

3. The composite transparent electrode of claim 1, wherein a thickness of the metal nitride thin film is less than or equal to about 20 nm.

4. The composite transparent electrode of claim 1, wherein the composite transparent electrode has a sheet resistance of less than or equal to about 450 Ω/sq.

5. The composite transparent electrode of claim 1, wherein the composite transparent electrode has a transmittance of greater than or equal to about 75 with respect to light of a wavelength of about 550 nm.

6. The composite transparent electrode of claim 1, wherein the composite transparent electrode has a carrier mobility of greater than or equal to about 9 cm$^2$/V*S and a carrier concentration of greater than or equal to about $2\times10^{20}$/cm3 when a thickness of the composite transparent electrode is about 110 nm.

7. A method of producing the composite transparent electrode of claim 1, comprising:
   providing a substrate;
   conducting reactive sputtering or sputtering to form a first metal oxide thin film on the substrate;
   conducting reactive sputtering to form a second metal nitride thin film on the first metal oxide thin film; and
   forming a third metal oxide thin film on the second metal nitride thin film,
   wherein the second metal nitride thin film includes at least one of indium (In), zinc (Zn), and gallium (Ga), and
   the first and third metal oxide thin films include at least one of indium (In), zinc (Zn), tin (Sn), and titanium (Ti).

8. The method of claim 7, wherein the sputtering or the reactive sputtering is conducted at a temperature less than or equal to about 30° C.

9. The method of claim 7, wherein the reactive sputtering is conducted in the presence of a sputtering gas including at least one of nitrogen gas and an inert gas.

10. The method of claim 9, wherein the inert gas comprises at least one of argon (Ar), helium (He), neon (Ne), krypton (Kr), and a combination thereof.

11. The method of claim 9, wherein the sputtering gas has a volume ratio of the nitrogen gas to the inert gas greater than or equal to about 0.1.

12. An electronic device comprising the composite transparent electrode of claim 1.

13. The electronic device of claim 12, wherein the metal nitride thin film comprises at least one of InN and $Zn_3N_2$.

14. The electronic device of claim 12, wherein the thickness of the metal nitride thin film is less than or equal to about 20 nm.

15. The electronic device of claim 12, wherein the electronic device is a flat panel display, a touch screen panel, a photovoltaic cell, an e-window, a heat mirror, or a transparent transistor.

16. The composite transparent electrode of claim 1, wherein the composite transparent electrode has a thickness of less than or equal to about 200 nm.

* * * * *